(12) United States Patent
Wei et al.

(10) Patent No.: US 9,059,417 B1
(45) Date of Patent: Jun. 16, 2015

(54) PHOTODETECTORS BASED ON WURTZITE MGZNO

(71) Applicant: University of Central Florida Research Foundation, Inc., Orlando, FL (US)

(72) Inventors: Ming Wei, Orlando, FL (US); R. Casey Boutwell, Oviedo, FL (US); Winston V. Schoenfeld, Oviedo, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 0 days.

(21) Appl. No.: 14/291,793

(22) Filed: May 30, 2014

Related U.S. Application Data

(60) Provisional application No. 61/831,867, filed on Jun. 6, 2013.

(51) Int. Cl.
*H01L 51/42* (2006.01)
*H01L 27/14* (2006.01)

(52) U.S. Cl.
CPC ............... *H01L 51/42* (2013.01); *H01L 27/14* (2013.01)

(58) Field of Classification Search
CPC ..... H01L 51/42; H01L 51/4233; H01L 27/14; H01L 27/14649; H01L 27/30; H01L 31/101; H01L 31/09
USPC .......................... 257/43, 431, 448; 438/57, 85
See application file for complete search history.

(56) References Cited

U.S. PATENT DOCUMENTS

| | | | |
|---|---|---|---|
| 7,132,668 B2 | 11/2006 | Vispute et al. | |
| 2008/0182092 A1* | 7/2008 | Bondokov et al. | 428/220 |

OTHER PUBLICATIONS

Speakman, S. Introduction to High Resolution X-Ray Diffraction of Epitaxial Thin Films [PowerPoint slides]. Retrieved from http://prisim.mit.edu/xray/.*
L. Wachnicki, et al., "Epitaxial ZnO Films Grown at Low Temperature for Novel Electronic Application", Acta Physica Polonica A, vol. 120 (2011), No. 6-A, Proceedings of the E-MRS Fall Meeting, Symposium H: Warsaw, Poland, Sep. 19-23, 2011, pp. A-7-A-10.

* cited by examiner

*Primary Examiner* — Daniel Whalen
*Assistant Examiner* — Suberr Chi
(74) *Attorney, Agent, or Firm* — Jetter & Associates, P.A.

(57) ABSTRACT

A photodetector (PD) includes a substrate, and a ZnO nucleation layer on the substrate. A wurtzite $Mg_xZn_{1-x}O$ layer is on the ZnO nucleation layer, wherein x is a mole fraction between 0 and 0.62. A level of crystallinity of the wurtzite $Mg_xZn_{1-x}O$ layer characterized by x-ray diffraction with a deconvolution of a triple-crystal ω rocking curve of a ZnO (0002) peak has a narrow component with a full width at half maximum (FWHM) less than or equal to (≤) 20 arc/s. First and second spaced apart electrodes are on a surface of the wurtzite $Mg_xZn_{1-x}O$ layer. The mole fraction x can be between 0.20 and 0.46, including between 0.37 and 0.46, and provide a PD responsivity of at least 20 A/W at 5V in the solar blind region from 200 nm to 290 nm.

20 Claims, 5 Drawing Sheets

PHOTODETECTORS BASED ON WURTZITE MGZNO

CROSS REFERENCE TO RELATED APPLICATIONS

This application claims the benefit of Provisional Application Ser. No. 61/831,867 entitled "DEEP ULTRAVIOLET PHOTODETECTORS BASED ON WURTZITE MgZnO WITH ZnO HOMONUCLEATION LAYER", filed on Jun. 6, 2013, which is herein incorporated by reference in its entirety.

STATEMENT REGARDING FEDERALLY SPONSORED RESEARCH

This invention was made with Government support under Cooperative Agreement Number W911NF-11-2-0025 awarded by the U.S. Army Research Laboratory. The Government has certain rights in this invention.

FIELD

Disclosed embodiments relate to optoelectronic and microelectronic devices and fabrication methods thereof, and to metal oxide semiconductor layers and articles including Ultraviolet (UV) photodetectors therefrom.

BACKGROUND

UV photodetectors and light emitters find numerous uses including applications in the defense, commercial, and scientific arenas. These include, for example, covert space-to-space communications, missile threat detection, chemical and biological threat detection and spectroscopy, UV environmental monitoring, and germicidal cleansing. UV photodetectors and light emitters operating in the solar blind region are of special interest. The solar blind region corresponds to the spectral UV region where strong upper atmospheric absorption of solar radiation occurs, generally at wavelengths from about 200 nm to about 290 nm. This creates a natural low background window for detection of man-made UV sources on and proximate to the earth's surface.

Semiconductor materials having a 25° C. band gap of about 4 eV to 6 eV have been used to sense or generate solar blind UV radiation. Conventional approaches have used compound semiconductor materials such as AlGaN, MgZnO, or BeZnO, which generally have wurtzite (hexagonal) lattice structures. AlGaN is known to suffer from various problems including lattice cracking due to strain, generally high dislocation density, and lattice mismatch with respect to the layer it is grown on (all such effects are generally interrelated). High dislocation density undesirably reduces internal quantum efficiency.

The crystal structure of $Mg_xZn_{1-x}O$ can be cubic or wurtzite, depending on the Mg/Zn ratios. High % Mg compositions result in a cubic structure while low % Mg compositions result in a Wurtzite structure. However, the crystal structure difference and large lattice mismatch between ZnO (wurtzite, 3.25 Å) and MgO (rock salt, 4.22 Å) causes phase segregation in $Mg_xZn_{1-x}O$ with Mg compositions between about 37%<x<62% BeZnO is generally considered a somewhat more promising semiconductor material, but has experienced doping difficulties, particularly difficulties in obtaining high mobility and stable p-type doping.

Epitaxial monocrystalline ZnO on sapphire ($Al_2O_3$) substrates is known to be a relative low cost PD option. Process temperatures used to obtain crystalline ZnO commonly exceed 500° C. There is a large in-plane lattice mismatch (18%) between c-oriented ZnO and sapphire, typically resulting in a high dislocation density of generally more than $10^9$ $cm^{-2}$ for epitaxial ZnO layers, which may lead to low responsivity for photodiodes made from or on such layers.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments include methods of forming photodiodes (PDs) including forming a crystalline ZnO nucleation layer grown at relatively low temperature (LT), such as 300° C. to 400° C., on a crystalline substrate. The thickness of the ZnO nucleation layer can be from 15 nm to 40 nm, such as from 20 nm to 25 nm in one particular embodiment.

A single crystal wurtzite $Mg_xZn_{1-x}O$ layer, where x is the mole fraction between 0 and 0.62, is grown at a higher temperature relative the ZnO nucleation layer on top of the ZnO nucleation layer. Experimental data for an example single crystal wurtzite $Mg_xZn_{1-x}O$ layer (x=0.09) has shown high quality evidenced by a level of crystallinity from x-ray diffraction showing a full width at half maximum for ω of <20 arc/sec, such as a ω value of 13 to 20 arc/sec. Disclosed ZnO nucleation layers have been demonstrated to have sub-nanometer (<1 nm) root mean square (rms) surface roughness, such as measured by atomic force microscopy. A LT ZnO nucleation layer has been found to be important to the interfacial region to suppress the defects induced by lattice mismatch and produces a smooth surface that enables high quality 2D epitaxial growth of a single crystal wurtzite $Mg_xZn_{1-x}O$ layer to follow. The x-ray diffraction derived triple-crystal ω rocking curve measured on the maximum of the ZnO (0002) peak can be deconvolved into a narrow curve (e.g., FWHM=13 to 17 arc/s) and a wide diffuse base, related to the bottom structurally deteriorated sub-layer (ZnO nucleation layer) with a FWHM of >60 arc/sec, such as ~120 arc/s. With the single crystal wurtzite $Mg_xZn_{1-x}O$ layer with x=0 (ZnO), the FWHM of the (0002) HT ZnO peak (13 arc/s) described below is the highest crystallinity known. No cubic phase was observed in X-ray diffraction measurements performed on an example wurtzite $Mg_xZn_{1-x}O$ layer deposited on a LT ZnO nucleation layers with x being 0.37 to as high as 0.46. This is an unexpected result since it is known in the art that phase segregation occurs for x between 0.36 and 0.62 so that wurtzite $Mg_xZn_{1-x}O$ detectors in solar blind region have not been possible before due to phase segregation.

An optional epitaxial ZnO layer can be deposited on the ZnO nucleation layer at 450 to 525° C. and the wurtzite MgZnO layer can be deposited thereon at 400° C. to 500° C., such as around 430° C. using methods including plasma-assisted molecular beam epitaxy (MBE). The wurtzite $Mg_xZn_{1-x}O$ layer can have an x-value between 0 and 0.46, such as 0.2 to 0.46. As known in the art, wurtzite is hexagonal crystal system used by various binary compounds and ternary compounds.

Wurtzite $Mg_xZn_{1-x}O$ has been found to provide high performance PDs and emitters operating in the UV spectral region, including the solar blind region from 200 nm to 290 nm for x >about 0.3. By changing the Mg concentration, $Mg_xZn_{1-x}O$ has been found to provide a tunable 25° C. bandgap energy from 3.3 eV for wurtzite ZnO (no Mg) to 7.8 eV for rock salt MgO (no Zn). As described below, high crystal and optical quality epitaxial single crystal wurtzite $Mg_xZn_{1-x}$ O layers were obtained on crystalline ZnO nucleation layers on c-plane sapphire substrates by plasma-assisted MBE.

By tuning the Mg/Zn flux ratio during $Mg_xZn_{1-x}O$ deposition, a steep optical absorption edge of the wurtzite $Mg_xZn_{1-x}O$ with a spectral cutoff wavelength ranging from 278 nm to 377 nm was demonstrated, corresponding to the mole fraction x ranging from 0 (377 nm) to 0.46 (278 nm). As described in more detail in the examples section, photoconductive and Schottky barrier metal-semiconductor-metal (MSM) wurtzite $Mg_xZn_{1-x}O$ PDs with an interdigitated electrode geometry and active surface area of 1 $mm^2$ were fabricated. The I-V characteristics, in dark and under UV illumination, as well as spectral and temporal responses were characterized at zero-bias and 5V bias conditions. For $Mg_xZn_{1-x}O$ with x=0.46 PD responsivity was found to be as high as 200 A/W at 5 V with a rejection ratio of two orders of magnitude demonstrated in the solar blind spectral range from 200 nm to 290 nm with a spectral cutoff at 278 nm (the spectral cutoff being the intercept of the linear portion of the absorption edge on wavelength axis in a Tauc-like plot).

DETAILED DESCRIPTION

Figure 1A:
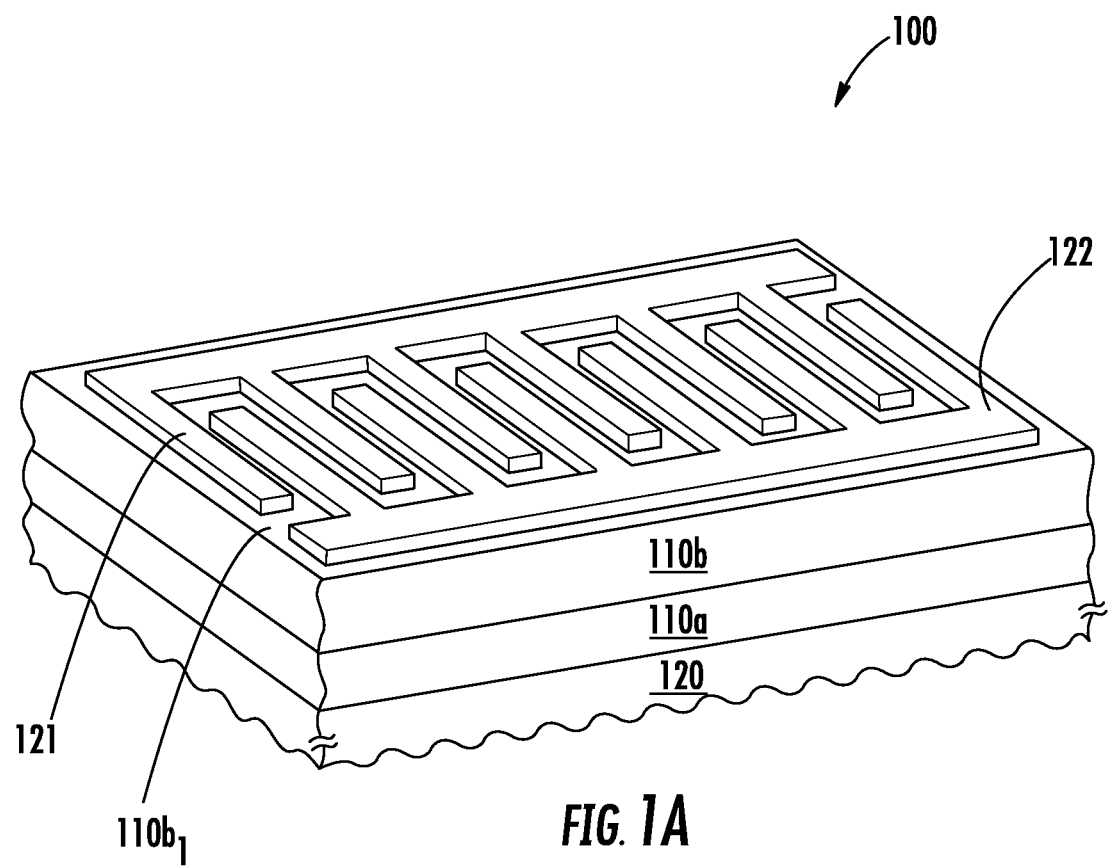
FIG. 1A is a cross sectional depiction of an example MSM PD comprising electrodes shown as interdigitated metal fingers and oppositely laying on the surface of a wurtzite $Mg_xZn_{1-x}O$ layer on a ZnO nucleation layer on a substrate, according to an example embodiment.

Disclosed embodiments in this Disclosure are described with reference to the attached figures, wherein like reference numerals are used throughout the figures to designate similar or equivalent elements. The figures are not drawn to scale and they are provided merely to illustrate the disclosed embodiments. Several aspects are described below with reference to example applications for illustration.

It should be understood that numerous specific details, relationships, and methods are set forth to provide a full understanding of the disclosed embodiments. One having ordinary skill in the relevant art, however, will readily recognize that the subject matter disclosed herein can be practiced without one or more of the specific details or with other methods. In other instances, well-known structures or operations are not shown in detail to avoid obscuring structures or operations that are not well-known. This Disclosure is not limited by the illustrated ordering of acts or events, as some acts may occur in different orders and/or concurrently with other acts or events. Furthermore, not all illustrated acts or events are required to implement a methodology in accordance with this Disclosure.

Notwithstanding that the numerical ranges and parameters setting forth the broad scope of this Disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Cubic $Mg_xZn_{1-x}O$ thin films are known having a Mg composition above 62%, providing deep UV applications. However, cubic $Mg_xZn_{1-x}O$ is recognized herein to suffer from low crystal quality and PDs based on known cubic $Mg_xZn_{1-x}O$ show low responsivity typically limited to several hundred mA/W (e.g., 300 mA/W) at 5V, or lower. Wurtize $Mg_xZn_{1-x}O$ can provide somewhat higher responsivity, but suffers when adding Mg sufficient to extend into the solar blind region due to phase segregation issues. Compared to MSM PDs from cubic $Mg_xZn_{1-x}O$, disclosed MSM PDs from wurtzite $Mg_xZn_{1-x}O$ on ZnO nucleation layers can have a Mg composition from 37% to as high as 46% which have been found to provide better performance due to the high quality wurtzite $Mg_xZn_{1-x}O$ single crystal obtained when grown on a disclosed ZnO nucleation layer and resulting high responsivity of the MSM PDs therefrom of at least 20 A/W up to 100 A/W, such as ≥200 A/W at 5V.

Disclosed embodiments provide single crystal wurtzite $Mg_xZn_{1-x}O$ layers with the option for a relatively high Mg concentration (e.g., x=0.20 to 0.46, or 0.37 to 0.46, or more) enabled by adding a LT ZnO nucleation layer on the substrate, such as grown at a temperature at 300° C. to 400° C., with 350° C. used in one particular embodiment. By tuning the Mg concentration through controlling the Mg/Zn flux ratio during the wurtzite $Mg_xZn_{1-x}O$ deposition, a steep optical absorption edge MSM PDs having wurtzite $Mg_xZn_{1-x}O$ with a spectral cutoff wavelength range can be designed from 277 nm to 377 nm, corresponding to x ranging from 0.46 to 0.

By disclosed embodiments including a LT ZnO nucleation layer on the substrate, the properties of the wurtzite $Mg_xZn_{1-x}O$ layer have been found to be improved and MSM PD responsivity has been found to be significantly increased, with a peak responsivity of at least 20 A/W with a 5V bias in a wavelength range of from about 200 nm to about 350 nm, with a peak responsivity of >20 A/W with a 5V bias, typically with a peak responsivity of above 200 A/W with a 5V bias. High responsivity is provided because of a high crystal quality wurtzite $Mg_xZn_{1-x}O$ layer, through a mole fraction x range confirmed experimentally from 0 and 0.46. As noted above, the ability to provide high crystal quality wurtzite $Mg_xZn_{1-x}O$ layer in a mole fraction (x) range from 0.37 to 0.46 is particularly unexpected as it is known in the art that phase segregation results when x is between 0.36 and 0.62 (Mg composition between 36% and 62%) so that one cannot make wurtzite detectors in solar blind region.

FIG. 1A is a cross sectional depiction of an example MSM PD 100 comprising first and second spaced apart electrodes 121 and 122 shown as interdigitated electrodes laying on the surface 110$b_1$ of stacked of metal oxide semiconductor layers including a single crystal epitaxial wurtzite $M_gxZ_{1-x}O$ layer (wurtzite $M_gxZ_{1-x}O$ layer) 110b, according to an example embodiment. As noted above, the mole fraction x can range from 0 to 0.62, such as 0.2 to 0.46, and the wurtzite $M_gxZ_{1-x}O$ layer 110b is epitaxial to the ZnO nucleation layer 110a that provides the function of a buffer layer and nucleation layer which is on a substrate 120. The ZnO nucleation layer 110a is typically 15 nm to 40 nm thick. The MSM PD 100 can operate as a solar-blind PD.

Figure 1B:
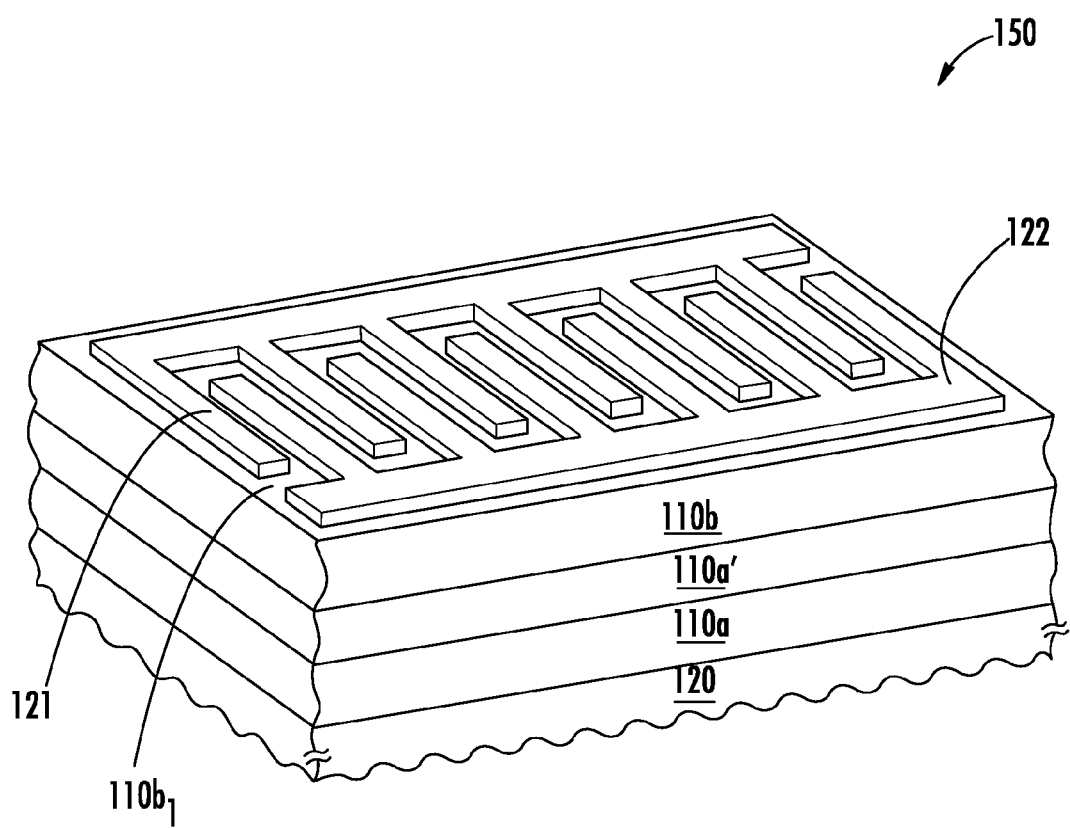
FIG. 1B is a cross sectional depiction of an example MSM PD based on the PD shown in FIG. 1A modified to add an epitaxial ZnO layer between the wurtzite $Mg_xZn_{1-x}O$ layer and the ZnO nucleation layer, according to an example embodiment.

Although the wurtzite $Mg_xZn_{1-x}O$ layer 110b is shown directly on the first ZnO layer 110a, an additional intervening high temperature ZnO nucleation layer (or layers) referred to herein as a second ZnO nucleation layer can be added between the wurtzite $Mg_xZn_{1-x}O$ layer 110b and the first ZnO buffer layer 110a to further improve the surface morphology and crystallinity of the wurtzite $Mg_xZn_{1-x}O$ layer 110b, which has been found to improve PD performance including responsivity. FIG. 1B is a cross sectional depiction of an example photodetector MSM PD 150 based on PD 100 modified to add an epitaxial ZnO layer 110a1 between the wurtzite $Mg_xZn_{1-x}O$ layer 110b and the ZnO nucleation layer 110a.

The epitaxial ZnO layer 110a' can comprise a high temperature (HT) grown ZnO layer relative to the deposition temperature used to deposit the ZnO nucleation layer 110a, such as grown at 500° C., and as noted above the first ZnO nucleation layer 110a can comprise a LT grown ZnO layer, such as epitaxially grown at 300° C. to 400° C., such as 350° C. in one particular embodiment. The degree of crystallinity will generally be less for the LT ZnO layer as compared to the HT ZnO layer(s), including in the final PD device. This difference in crystallinity can be evidenced by the Full Width of Half Maximum (FWHM) of the rocking curve of the respective X-ray diffraction peaks.

As known in the art, the narrower the FWHM, the higher the level of crystallinity is. HT-ZnO grown on LT-ZnO has been deconvolved into two peaks, one with very narrow FWHM attributed to HT ZnO evidencing very high crystallinity and the other peak with a broader FWHM and weaker peak is attributed to LT ZnO evidencing lower crystallinity. The FWHM for ZnO (0002) peaks were measured to be 13 arc sec and 17.8 arc sec for the HT ZnO layer and wurtzite $Mg_xZn_{1-x}O$ (with low Mg composition, e.g., being x=9%) respectively, indicating good ordering in the crystal growth direction.

If the wurtzite $Mg_xZn_{1-x}O$ layer 110b is thin (such as ≤300 nm), it is recognized the relatively low level of crystallinity of the ZnO nucleation layer 110a can cause recombination of photogenerated carriers, thus reducing the photo responsivity of the PD. Moreover, the ZnO nucleation layer 110a may absorb light with wavelengths above 370 nm and generate carriers, which can be collected by the contacts to the electrodes 121, 122 and can undesirably contribute to the photoresponse of the MSM PD.

It has been found to make deep UV MSM PDs without little responsivity for wavelengths above 300 nm influence by the ZnO nucleation layer 110a can be minimized by having the wurtzite $Mg_xZn_{1-x}O$ layer 110b 1 μm thick or more (e.g., 1 μm to 5 μm). This rather high relative thickness for the wurtzite $Mg_xZn_{1-x}O$ layer 110b has been found to provide two significant benefits: (1) the wurtzite $Mg_xZn_{1-x}O$ layer 110b is essentially fully relaxed and thus has less dislocations (defects); (2) and the photogenerated carriers in the ZnO nucleation layer 110a do not measurably contribute to the PD response, due to the thick wurtzite $Mg_xZn_{1-x}O$ layer 110b thereon.

The electrodes 121 and 122 form low resistance contacts to the wurtzite $Mg_xZn_{1-x}O$ layer 110b. The electrodes 121 and 122 can be formed by photolithography followed by deposition (e.g., sputtering or E-beam deposition) and then lift-off. In a typical embodiment where the electrodes 121, 122 are interdigitated, the gaps between the interdigitated fingers are several microns, such as from 2 μm to 15 μm. The substrate 120 can be a sapphire substrate, or other substrates such as ZnO or GaN.

The electrodes 121 and 122 can comprise a multi-layer metal stack including a low work function metal (defined as having a 25° C. work function <4 eV, such as Mg) between an adhesion layer (e.g., 2 to 5 nm Ni or Ti layer) and an oxidation resistant metal capping layer (e.g., Au or other noble metal). The low work function metal layer can be polycrystalline or single crystalline, and can be 10 nm to 30 nm thick in one embodiment. The oxidation resistant metal capping layer can be 60 nm thicker or higher

EXAMPLES

Disclosed embodiments are further illustrated by the following specific Examples, which should not be construed as limiting the scope or content of this Disclosure in any way.

The deposition of wurtzite $Mg_xZn_{1-x}O$ layer on a ZnO nucleation layer on a c-plane sapphire substrate was monitored in situ by reflection high-energy electron diffraction (RHEED). High quality single crystal wurtzite $Mg_xZn_{1-x}O$ layers having an active surface area of 1 mm$^2$ was found to be obtained by epitaxially depositing on a LT ZnO nucleation layer on a substrate, shown as ZnO nucleation layer 110a described above.

Elemental Zn (6N) and Mg (3N8) were evaporated from standard hot-lipped Knudsen cell and O (6N) fluxes were supplied by a radio-frequency (RF) radical cell ($f_0$=13.56 MHz). Base pressure in the growth chamber was ~2×10$^{-10}$ Torr. During the growth of ZnO layers, the pressure in the chamber was maintained around 3×10$^{-6}$ to 5×10$^{-6}$ Torr. To increase the homogeneity of heat conduction during the growth, 1 μm of Titanium was deposited on the backside of the sapphire substrate with a Temscal E-beam evaporation system (model FC-2000). The sample was thereafter degreased with iso-propanol and dried with a nitrogen gun. After this cleaning procedure, the substrate was immediately loaded on an indium free molybdenum holder and thermally cleaned at 600° C. in a buffer chamber (10$^{-9}$ Torr) for 4 hours before transferred to the growth chamber.

A low temperature (LT) ZnO homo-nucleation layer was first grown at 350° C. on the sapphire substrate. The oxygen plasma power was fixed at 350 W. Zinc cell temperature was controlled at 360° C., and Oxygen flux was controlled 1.5 sccm to keep oxygen rich conditions. A growth rate around 0.21 μm/h was achieved for nucleation layer as monitored by Laser reflectometry.

It was recognized because the sapphire substrate is oxygen terminated Zn can arrive at the surface and combine with the surface oxygen atoms with better migration ability. The Zn shutter was opened first for 3 seconds, allowing for about one monolayer of deposition followed by opening of the oxygen shutter. This sequence reliably generated a terrace-step morphology. After 7 minutes of growth, a 25 nm thick ZnO nucleation layer was epitaxially formed on the sapphire substrate.

The RHEED pattern of the ZnO nucleation layer was initially spotty, indicating a roughening of the growth surface. The pattern gradually transformed into a sharp streaky pattern after optional annealing at 600° C. for 30 minutes at pressure of $10^{-10}$ to $10^{-9}$ Torr indicating the ZnO nucleation layer was clean and flat after the annealing process. Annealing at a temperature high than 600° C. will not generally improve the RHEED pattern further. Using MBE a subsequent HT epitaxial ZnO layer can be optionally grown on the ZnO nucleation layer at 500° C. shown as epitaxial ZnO layer 110a1 described above relative to FIG. 1B.

The Zn to oxygen ratio was maintained for oxygen rich conditions at low flux to assure a slow growth rate for HT epitaxial ZnO layer, in this case, 0.15 m/h. The Zn to oxygen ratio was verified by varying Zn source temperatures to find the stoichiometric conditions where Zn source is 370° C. at oxygen flux of 1.3 sccm. This HT regime allowed for homogeneous diffusion of the atoms and prevention of 3D growth. The RHEED pattern taken of a 940 nm HT epitaxial ZnO layer was found to be clearly streaky, indicating 2D growth.

A $Mg_xZn_{1-x}O$ epilayer was grown directly on the LT ZnO nucleation layer using a similar PA-MBE method as described above for the growth of ZnO nucleation layer. The growth temperature for $Mg_xZn_{1-x}O$ used was 430° C., lower than that of the epitaxial ZnO layer. The Mg cell temperature varied from 350° C. to 420° C., corresponding to a Mg composition x change from 0% to 46%.

A Metal-semiconductor-metal (MSM) interdigital electrode geometry with Schottky interdigitated metal electrode fingers with a finger spacing ranging from 2 μm to 15 μm was then fabricated from disclosed epitaxial articles. A Ni/Au contact (20 nm/130 nm) was chosen for the Schottky contact to the wurtzite $Mg_xZn_{1-x}O$ layer. To characterize the photoresponse properties of the PDs, a 300 W Xe lamp was used as the excitation source and a monochrometer was used for scanning the photo response spectrum.

Figure 2:
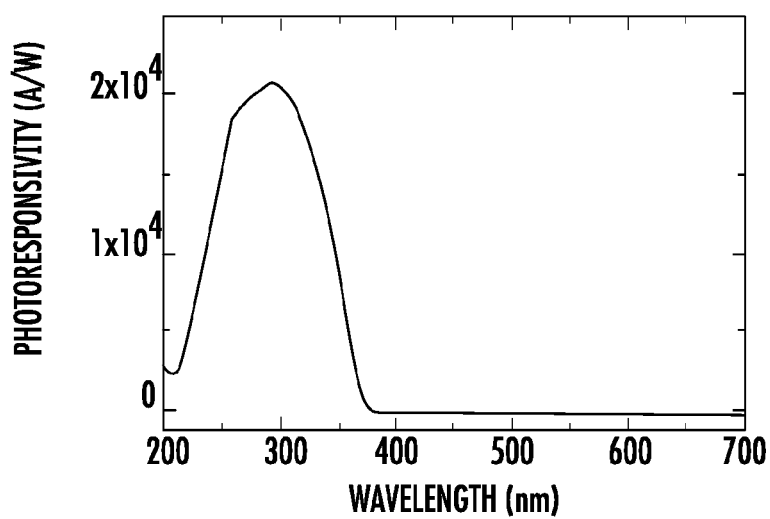
FIG. 2 shows the responsivity of an example MSM PD comprising wurtzite ZnO measured at a 5 V bias.

FIG. 2 shows the response spectrum of an example MSM PD including wurtzite ZnO at a 5 V bias and 25° C. The peak responsivity (R) is seen to be around $2\times10^4$ A/W below 380 nm, at about 300 nm. The rejection ratio of $R_{300\,nm}/R_{400\,nm}$=526, and $R_{300\,nm}/R_{500\,nm}$=86,000. This is comparable to the highest reported responsivity for a ZnO PD. However, disclosed PDs had a smaller bias, which means the responsivity should be slightly higher. The quantum efficiency (ii) and gain (g) of the PD can be expressed in the following formula:

$$\eta g = Rh\nu/q \quad (1)$$

where R is the responsivity depending on voltage, q is the electron charge and v is the light frequency. The μg for the example MSM PD was estimated to be $6.6\times10^4$ at 5 V bias.

Figure 3A:
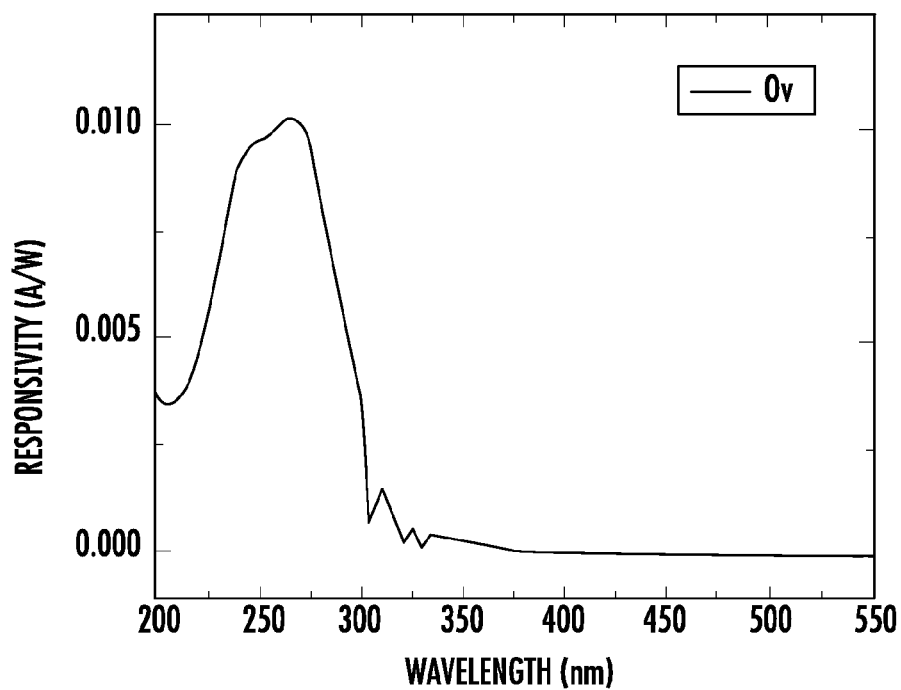
FIGS. 3A and 3B show responsivity data for of an example MSM PD comprising a wurtzite $Mg_{0.46}Zn_{0.54}O$ layer on a ZnO nucleation layer on a sapphire substrate measured at 0 V bias and a 5 V bias.
Figure 3B:
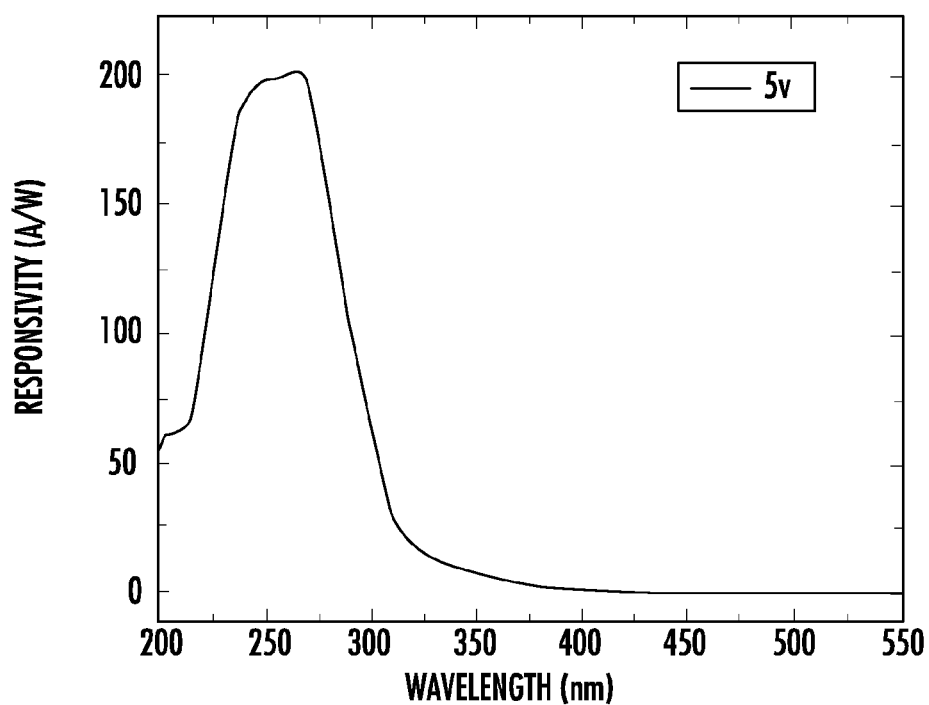
Figure 4:
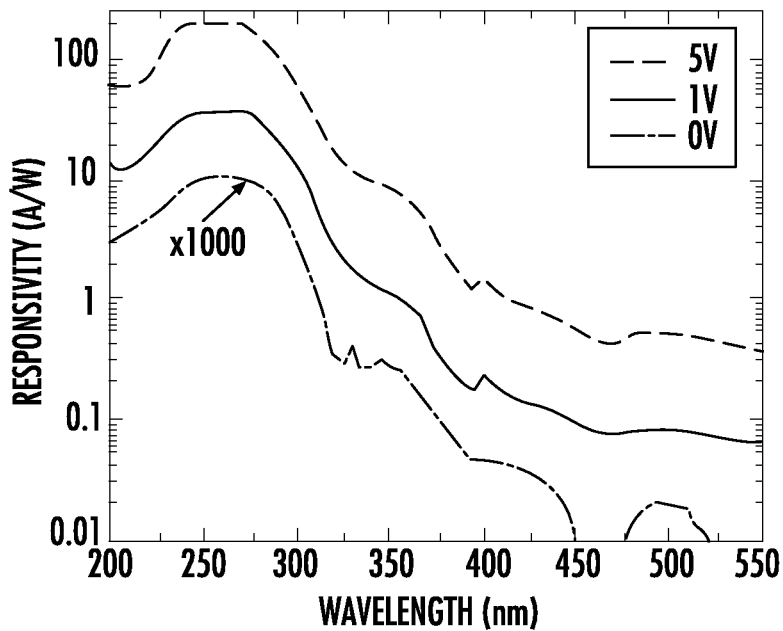
FIG. 4 is a log scale plot of the responsivity of an example MSM PD comprising wurtzite $Mg_xZn_{1-x}O$ on a ZnO nucleation layer on a sapphire substrate with 10 µm pitch interdigitated electrodes at biases of 0, 1 V and 5 V.

FIGS. 3A and 3B show the photoresponse of an example MSM PD including wurtzite $Mg_{0.46}Zn_{0.54}O$ on a ZnO nucleation layer at a 0V bias and 5V bias, respectively. The log scale is shown in FIG. 4 where the main optical cutoff in the 280-300 nm range corresponds to the fundamental optical absorption band in the $Mg_{0.46}Zn_{0.54}O$ layer. The small shoulder that appears near 310 nm to 375 nm is believed to be due to the photocurrent contribution from the thin ZnO buffer/nucleation layer.

Schottky PD devices including wurtzite $Mg_{0.46}Zn_{0.54}O$ on a LT ZnO nucleation layer show responsivity at 265 nm of 0.01 A/W with dark current of 23 pA, and rejection ratios $R_{265\,nm}/R_{400\,nm}$=180 and $R_{265\,nm}/R_{500\,nm}$=505. Photoconductive devices show responsivity at 260 nm of 200 A/W, resulting in a photoconductive gain of $1\times10^3$ with dark current at 5V of 2.7 μA, and rejection ratio (RR) $R_{265\,nm}/R_{400\,nm}$=140 and RR $R_{265\,nm}/R_{500\,nm}$=392. These results evidence the highest photoresponse in the solar blind region believed to ever have been reported.

Figure 5A:
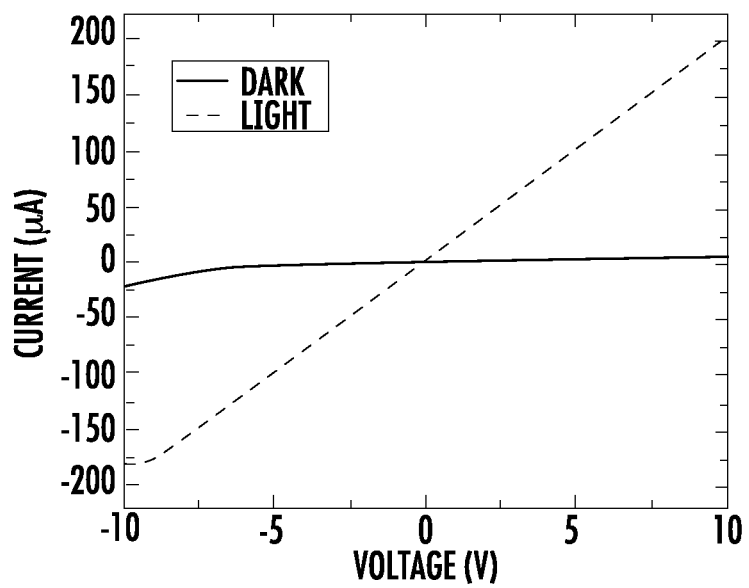
FIG. 5A shows I-V characteristics of example MSM PDs comprising wurtzite $Mg_{0.46}Zn_{0.54}O$ on a ZnO nucleation layer on a sapphire substrate with 10 µm interdigitated electrode spacing taken in the dark and under light illumination with λ=300 nm, 22 µW optical power.
Figure 5B:
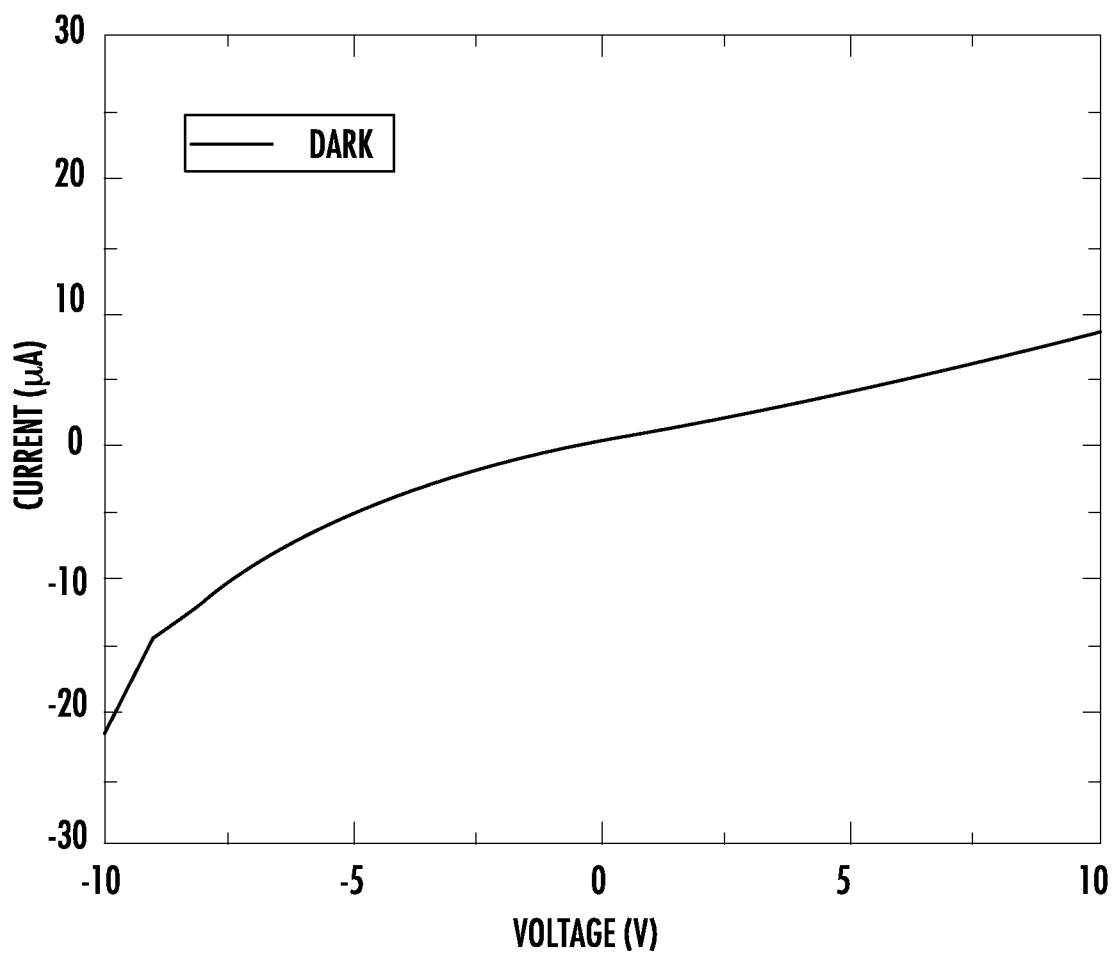
FIG. 5B is a magnified dark I-V curve for the PD.

To explain the high responsivity of disclosed MSM PDs including wurtzite $Mg_xZn_{1-x}O$ on a LT ZnO nucleation layer, I-V curves were generated that are shown in FIG. 5A for disclosed MSM PDs including wurtzite $Mg_xZn_{1-x}O$ with a relatively high Mg composition (x=0.46) having 10 μm interdigital electrode finger spacing measured in the dark and under light illumination. The high gain can likely be attributed to the carrier trapping process which was identified by the asymmetric barrier height at the interdigital electrodes. In FIG. 5B, the dark I-V curve shows clear asymmetric Schottky behavior in the positive and negative region, implying carrier trapping at the metal wurtzite $Mg_xZn_{1-x}O$ interface.

While various disclosed embodiments have been described above, it should be understood that they have been presented by way of example only, and not limitation. Numerous changes to the subject matter disclosed herein can be made in accordance with this Disclosure without departing from the spirit or scope of this Disclosure, such as coating the surface of device with an antireflective layer. In addition, while a particular feature may have been disclosed with respect to only one of several implementations, such feature may be combined with one or more other features of the other implementations as may be desired and advantageous for any given or particular application.

Thus, the breadth and scope of the subject matter provided in this Disclosure should not be limited by any of the above explicitly described embodiments. Rather, the scope of this Disclosure should be defined in accordance with the following claims and their equivalents.

The invention claimed is:

1. A photodetector (PD), comprising:
    a substrate;
    a ZnO nucleation layer on said substrate;
    a wurtzite $Mg_xZn_{1-x}O$ layer epitaxial to and on said ZnO nucleation layer, wherein x is a mole fraction between 0 and 0.62,
    wherein a level of crystallinity of said wurtzite $Mg_xZn_{1-x}O$ layer characterized by x-ray diffraction with a deconvolution of a triple-crystal ω rocking curve of a ZnO (0002) peak has a narrow component with a full width at half maximum (FWHM) less than or equal to (≤) 20 arc/s, and
    first and second spaced apart electrodes on said wurtzite $Mg_xZn_{1-x}O$ layer.

2. The PD of claim 1, wherein said x is between 0.20 and 0.46.

3. The PD of claim 2, wherein a peak responsivity of said PD is at least 20 A/W with 5V bias in a wavelength range from 200 nm to 290 nm.

4. The PD of claim 1, wherein a thickness of said wurtzite $Mg_xZn_{1-x}O$ layer is between 0.5 μm and 5 μm.

5. The PD of claim 1, further comprising an epitaxial ZnO layer between said ZnO nucleation layer and said wurtzite $Mg_xZn_{1-x}O$ layer, wherein said epitaxial ZnO layer has a larger average grain size relative to a grain size of said ZnO nucleation layer.

6. The PD of claim 5, wherein said x is between 0.37 and 0.46, and wherein a peak responsivity of said PD is at least 20 A/W with 5V bias in a wavelength range from 200 nm to 290 nm.

7. The PD of claim 5, wherein said x is between 0.37 and 0.46, and wherein a peak responsivity of said PD is at least 100 A/W with 5V bias in a wavelength range from 200 nm to 290 nm.

8. The PD of claim 1, wherein said substrate comprises sapphire, GaN or ZnO.

9. The PD of claim 1, wherein said first and second spaced apart electrodes comprise interdigitated metal fingers having a spacing from 2 μm to 15 μm.

10. The PD of claim 1, wherein a root mean square (rms) surface roughness of said ZnO nucleation layer is <1 nm and a thickness of said ZnO nucleation layer is from 15 nm to 40 nm.

11. A method of fabricating a photodetector (PD), comprising:
- depositing a ZnO nucleation layer on a substrate at a deposition temperature less than or equal to (≤) 400° C.,
- depositing a wurtzite $Mg_xZn_{1-x}O$ layer epitaxial to and on said ZnO nucleation layer, wherein x is a mole fraction between 0 and 0.62, and
- forming first and second spaced apart electrodes on said wurtzite $Mg_xZn_{1-x}O$ layer,
- wherein a level of crystallinity said wurtzite $Mg_xZn_{1-x}O$ layer characterized by x-ray diffraction with a deconvolution of a triple-crystal ω rocking curve of a ZnO (0002) peak has a narrow component with a full width at half maximum (FWHM) less than or equal to (≤) 20 arc/s.

12. The method of claim 11, wherein said depositing said wurtzite $Mg_xZn_{1-x}O$ layer comprises plasma-assisted molecular beam epitaxy (MBE).

13. The method of claim 11, wherein said x is between 0.20 and 0.46.

14. The method of claim 13, wherein a peak responsivity of said PD is at least 20 A/W with 5V bias in a wavelength range from 200 nm to about 350 nm.

15. The method of claim 11, further comprising depositing an epitaxial ZnO layer on said ZnO nucleation layer at a deposition temperature between 450° C. and 525° C.

16. The method of claim 15, wherein said x is between 0.37 and 0.46, and wherein a peak responsivity of said PD is at least 20 A/W with 5V bias in a wavelength range from 200 nm to 290 nm.

17. The method of claim 15, wherein said x is between 0.37 and 0.46, and wherein a peak responsivity of said PD is at least 100 A/W with 5V bias in a wavelength range from 200 nm to 290 nm.

18. The method of claim 11, wherein said forming said first and second spaced apart electrodes comprises forming interdigitated metal fingers having a spacing from 2 μm to 15 μm.

19. The method of claim 11, wherein a thickness of said wurtzite $Mg_xZn_{1-x}O$ layer is between 1 μm and 5 μm.

20. The method of claim 11, wherein a root mean square (rms) surface roughness of said ZnO nucleation layer is <1 nm and a thickness of said ZnO nucleation layer is from 15 nm to 40 nm.

* * * * *